(12) United States Patent
Kim et al.

(10) Patent No.: US 11,129,076 B2
(45) Date of Patent: *Sep. 21, 2021

(54) METHOD AND SYSTEM FOR BASEBAND PREDISTORTION LINEARIZATION IN MULTI-CHANNEL WIDEBAND COMMUNICATION SYSTEMS

(71) Applicant: DALI WIRELESS, INC., Menlo Park, CA (US)

(72) Inventors: Wan-Jong Kim, Coquitlam (CA); Kyoung Joon Cho, Coquitlam (CA); Jong Heon Kim, Seoul (KR); Shawn Patrick Stapleton, Vancouver (CA)

(73) Assignee: DALI WIRELESS, INC., Menlo Park, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/777,306

(22) Filed: Jan. 30, 2020

(65) Prior Publication Data

US 2020/0169937 A1     May 28, 2020

Related U.S. Application Data

(63) Continuation of application No. 15/875,936, filed on Jan. 19, 2018, which is a continuation of application
(Continued)

(51) Int. Cl.
*H04W 40/02* (2009.01)
*H03F 1/32* (2006.01)
(Continued)

(52) U.S. Cl.
CPC .......... *H04W 40/02* (2013.01); *H03F 1/3247* (2013.01); *H03F 3/24* (2013.01);
(Continued)

(58) Field of Classification Search
None
See application file for complete search history.

(56) References Cited

U.S. PATENT DOCUMENTS 4,638,248 A   1/1987 Schweickert
4,700,151 A   10/1987 Nagata
(Continued)

FOREIGN PATENT DOCUMENTS

CN   1288341 A   3/2001
CN   1297608 A   5/2001
(Continued)

OTHER PUBLICATIONS

U.S. Appl. No. 13/866,190, filed May 2, 2013, Yang.
(Continued)

*Primary Examiner* — Adolf Dsouza
(74) *Attorney, Agent, or Firm* — Artegis Law Group, LLP

(57) ABSTRACT

One exemplary embodiment is directed to an efficient baseband predistortion linearization method. The exemplary method at least reduces the spectral regrowth and compensates for memory effects in wideband communication systems. The exemplary method uses an effective multiplexing modulation technique, such as wideband code division multiple access and orthogonal frequency division multiplexing. Another exemplary aspect utilizes a piecewise pre-equalized lookup table based predistortion, which is a cascade of a lookup table predistortion and piecewise pre-equalizers.

13 Claims, 11 Drawing Sheets

Related U.S. Application Data

No. 14/991,264, filed on Jan. 8, 2016, now Pat. No. 9,913,194, which is a continuation of application No. 14/480,285, filed on Sep. 8, 2014, now Pat. No. 9,246,731, which is a continuation of application No. 13/887,133, filed on May 3, 2013, now Pat. No. 8,855,234, which is a continuation of application No. 13/404,679, filed on Feb. 24, 2012, now Pat. No. 8,509,347, which is a continuation of application No. 11/961,969, filed on Dec. 20, 2007, now Pat. No. 8,149,950.

(60) Provisional application No. 61/012,416, filed on Dec. 7, 2007, provisional application No. 60/877,035, filed on Dec. 26, 2006.

(51) Int. Cl.

| | |
|---|---|
| *H03F 3/24* | (2006.01) |
| *H04L 25/03* | (2006.01) |
| *H04L 27/36* | (2006.01) |
| *H04W 88/08* | (2009.01) |
| *H04W 24/02* | (2009.01) |
| *H04B 1/04* | (2006.01) |
| *H04W 24/04* | (2009.01) |
| *H04W 40/00* | (2009.01) |
| *H04L 27/26* | (2006.01) |
| *H04W 72/04* | (2009.01) |
| *H04B 7/022* | (2017.01) |

(52) U.S. Cl.
CPC .......... *H04B 1/0475* (2013.01); *H04B 7/022* (2013.01); *H04L 25/03343* (2013.01); *H04L 27/2618* (2013.01); *H04L 27/362* (2013.01); *H04W 24/02* (2013.01); *H04W 24/04* (2013.01); *H04W 40/00* (2013.01); *H04W 72/04* (2013.01); *H04W 72/0453* (2013.01); *H04W 88/085* (2013.01); *H03F 2200/336* (2013.01); *H03F 2200/57* (2013.01); *H03F 2201/3224* (2013.01); *H03F 2201/3233* (2013.01); *H04B 2001/0425* (2013.01); *H04L 2025/03414* (2013.01)

(56) References Cited

U.S. PATENT DOCUMENTS

| | | | |
|---|---|---|---|
| 4,890,300 A | 12/1989 | Andrews | |
| 4,929,906 A | 5/1990 | Voyce et al. | |
| 5,049,832 A | 9/1991 | Cavers | |
| 5,105,445 A | 4/1992 | Karam et al. | |
| 5,107,520 A | 4/1992 | Karam et al. | |
| 5,121,412 A | 6/1992 | Borth | |
| 5,132,639 A | 7/1992 | Blauelt et al. | |
| 5,396,190 A | 3/1995 | Murata | |
| 5,404,378 A | 4/1995 | Kimura | |
| 5,486,789 A | 1/1996 | Palandech et al. | |
| 5,524,286 A | 6/1996 | Chiesa et al. | |
| 5,579,342 A | 11/1996 | Crozier | |
| 5,589,797 A | 12/1996 | Gans et al. | |
| 5,596,600 A * | 1/1997 | Dimos .................. | G01S 19/21 370/208 |
| 5,655,220 A | 8/1997 | Weiland et al. | |
| 5,675,287 A | 10/1997 | Baker et al. | |
| 5,678,198 A | 10/1997 | Lemson | |
| 5,699,383 A | 12/1997 | Ichiyoshi | |
| 5,732,333 A | 3/1998 | Cox et al. | |
| 5,740,520 A | 4/1998 | Cyze et al. | |
| 5,757,229 A | 5/1998 | Mitzlaff | |
| 5,786,728 A | 7/1998 | Alinikula | |
| 5,831,479 A | 11/1998 | Leffel et al. | |
| 5,870,668 A | 2/1999 | Takano et al. | |
| 5,898,338 A | 4/1999 | Proctor et al. | |
| 5,920,808 A | 7/1999 | Jones et al. | |
| 5,923,712 A | 7/1999 | Leyendecker et al. | |
| 5,936,464 A | 8/1999 | Grondahl | |
| 5,937,011 A | 8/1999 | Carney et al. | |
| 5,949,283 A * | 9/1999 | Proctor ............... | H03F 1/3223 330/149 |
| 5,959,499 A | 9/1999 | Khan et al. | |
| 5,959,500 A | 9/1999 | Garrido | |
| 5,963,549 A | 10/1999 | Perkins et al. | |
| 5,973,011 A | 10/1999 | Noack et al. | |
| 6,054,896 A * | 4/2000 | Wright ................. | H03F 1/3247 330/149 |
| 6,055,418 A | 4/2000 | Harris et al. | |
| 6,081,158 A | 6/2000 | Twitchell et al. | |
| 6,091,941 A | 7/2000 | Moriyama et al. | |
| 6,124,758 A | 9/2000 | Korte et al. | |
| 6,141,390 A | 10/2000 | Cova | |
| 6,166,601 A | 12/2000 | Shalom et al. | |
| 6,208,698 B1 | 3/2001 | Marchesani et al. | |
| 6,215,354 B1 | 4/2001 | Kolanek et al. | |
| 6,236,267 B1 | 5/2001 | Anzil | |
| 6,240,144 B1 | 5/2001 | Ha | |
| 6,242,979 B1 | 6/2001 | Li | |
| 6,246,286 B1 | 6/2001 | Persson | |
| 6,246,865 B1 | 6/2001 | Lee | |
| 6,252,912 B1 | 6/2001 | Salinger | |
| 6,275,685 B1 | 8/2001 | Wessel et al. | |
| 6,288,610 B1 | 9/2001 | Miyashita | |
| 6,301,579 B1 | 10/2001 | Becker | |
| 6,313,703 B1 | 11/2001 | Wright et al. | |
| 6,314,142 B1 | 11/2001 | Perthold et al. | |
| 6,315,189 B1 | 11/2001 | Williams | |
| 6,320,463 B1 | 11/2001 | Leva et al. | |
| 6,351,189 B1 | 2/2002 | Hirvilampi | |
| 6,356,146 B1 | 3/2002 | Wright et al. | |
| 6,356,555 B1 | 3/2002 | Rakib et al. | |
| 6,359,504 B1 | 3/2002 | Cozzarelli | |
| 6,373,902 B1 | 4/2002 | Park et al. | |
| 6,388,518 B1 | 5/2002 | Miyatani | |
| 6,400,774 B1 | 6/2002 | Matsuoka et al. | |
| 6,424,225 B1 | 7/2002 | Choi et al. | |
| 6,430,402 B1 | 8/2002 | Agahi-Kesheh | |
| 6,437,644 B1 | 8/2002 | Kenington | |
| 6,489,846 B2 | 12/2002 | Hatsugai | |
| 6,512,417 B2 | 1/2003 | Booth et al. | |
| 6,549,067 B1 | 4/2003 | Kenington | |
| 6,552,609 B2 | 4/2003 | Hamada et al. | |
| 6,552,634 B1 | 4/2003 | Raab | |
| 6,566,944 B1 | 5/2003 | Pehlke et al. | |
| 6,587,514 B1 | 7/2003 | Wright et al. | |
| 6,591,090 B1 | 7/2003 | Vuorio et al. | |
| 6,600,406 B1 | 7/2003 | Ha | |
| 6,600,792 B2 | 7/2003 | Antonio et al. | |
| 6,614,854 B1 | 9/2003 | Chow et al. | |
| 6,625,429 B1 | 9/2003 | Yamashita | |
| 6,639,050 B1 | 10/2003 | Kieliszewski | |
| 6,639,463 B1 | 10/2003 | Ghanadan et al. | |
| 6,639,466 B2 | 10/2003 | Johnson | |
| 6,639,950 B1 | 10/2003 | Lagerblom et al. | |
| 6,677,870 B2 | 1/2004 | Im et al. | |
| 6,697,436 B1 | 2/2004 | Wright et al. | |
| 6,703,897 B2 | 3/2004 | O'Flaherty et al. | |
| 6,741,662 B1 | 5/2004 | Francos et al. | |
| 6,741,663 B1 | 5/2004 | Tapio et al. | |
| 6,741,867 B1 | 5/2004 | Tetsuya | |
| 6,747,649 B1 | 6/2004 | Sanz-Pastor et al. | |
| 6,751,447 B1 | 6/2004 | Jin et al. | |
| 6,794,931 B2 | 9/2004 | Kenington | |
| 6,885,241 B2 | 4/2005 | Huang et al. | |
| 6,898,252 B1 | 5/2005 | Yellin et al. | |
| 6,907,085 B2 | 6/2005 | Kubo et al. | |
| 6,963,242 B2 | 11/2005 | White et al. | |
| 6,973,139 B2 | 12/2005 | Ahn et al. | |
| 6,983,025 B2 | 1/2006 | Schell | |
| 6,985,704 B2 | 1/2006 | Yang et al. | |
| 6,998,909 B1 | 2/2006 | Mauer | |
| 7,023,273 B2 | 4/2006 | Johnson et al. | |
| 7,031,749 B1 | 4/2006 | Mitama | |

(56) References Cited

U.S. PATENT DOCUMENTS

| | | |
|---|---|---|
| 7,034,612 B2 | 4/2006 | Kim |
| 7,035,345 B2 | 4/2006 | Jeckeln et al. |
| 7,042,287 B2 | 4/2006 | Robinson |
| 7,061,314 B2 | 6/2006 | Kwon et al. |
| 7,064,606 B2 | 6/2006 | Louis |
| 7,068,984 B2 | 6/2006 | Mathe et al. |
| 7,071,777 B2 | 7/2006 | McBeath et al. |
| 7,079,818 B2 | 7/2006 | Khorram |
| 7,098,734 B2 | 8/2006 | Hongo et al. |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,123,890 B2 | 10/2006 | Kenington et al. |
| 7,151,913 B2 | 12/2006 | Ahmed |
| 7,158,765 B2 | 1/2007 | Blair et al. |
| 7,190,222 B2 | 3/2007 | Okazaki et al. |
| 7,193,471 B2 | 3/2007 | Tsutsui et al. |
| 7,193,472 B2 | 3/2007 | Gotou et al. |
| 7,197,085 B1 | 3/2007 | Vella-Coleiro |
| 7,248,642 B1 | 7/2007 | Vella-Coleiro |
| 7,251,293 B2 | 7/2007 | Vella-Coleiro |
| 7,259,630 B2 | 8/2007 | Bachman, II et al. |
| 7,301,402 B2 | 11/2007 | Norris et al. |
| 7,321,635 B2 | 1/2008 | Ocenasek et al. |
| 7,321,636 B2 | 1/2008 | Harel et al. |
| 7,333,559 B2 | 2/2008 | Song et al. |
| 7,372,918 B2 | 5/2008 | Muller et al. |
| 7,409,007 B1 | 8/2008 | Johnson et al. |
| 7,469,491 B2 | 12/2008 | McCallister et al. |
| 7,493,094 B2 | 2/2009 | Ichitsubo et al. |
| 7,593,710 B2 | 9/2009 | Brigaud et al. |
| 7,702,300 B1 | 4/2010 | McCune |
| 7,826,810 B2 | 11/2010 | Carmel et al. |
| 7,831,221 B2 | 11/2010 | Leffel et al. |
| RE42,287 E | 4/2011 | Apodaca et al. |
| 8,064,850 B2 | 11/2011 | Yang et al. |
| 8,149,950 B2 | 4/2012 | Kim et al. |
| 8,213,884 B2 | 7/2012 | Kim et al. |
| 8,326,238 B2 | 12/2012 | Yang et al. |
| 8,380,143 B2 | 2/2013 | Yang et al. |
| 8,401,499 B2 | 3/2013 | Kim et al. |
| 8,472,897 B1 | 6/2013 | Yang |
| 8,509,347 B2 | 8/2013 | Kim et al. |
| 8,548,403 B2 | 10/2013 | Kim et al. |
| 8,620,234 B2 | 12/2013 | Yang et al. |
| 8,682,338 B2 | 3/2014 | Lemson et al. |
| 8,731,495 B2 | 5/2014 | Yang et al. |
| 8,811,917 B2 | 8/2014 | Kim et al. |
| 8,855,234 B2 | 10/2014 | Kim et al. |
| 9,026,067 B2 | 5/2015 | Stapleton et al. |
| 9,031,521 B2 | 5/2015 | Yang et al. |
| 9,054,758 B2 | 6/2015 | Yang et al. |
| 9,077,297 B2 | 7/2015 | Yang et al. |
| 9,246,731 B2 | 1/2016 | Kim et al. |
| 9,374,196 B2 | 6/2016 | Yang et al. |
| 9,742,446 B2 | 8/2017 | Yang et al. |
| 9,768,739 B2 | 9/2017 | Kim et al. |
| 9,913,194 B2 | 3/2018 | Kim et al. |
| 10,097,142 B2 | 10/2018 | Yang et al. |
| 10,305,521 B2 | 5/2019 | Yang et al. |
| 10,693,425 B2 | 6/2020 | Yang et al. |
| 2001/0005402 A1 | 6/2001 | Nagatani et al. |
| 2001/0051504 A1 | 12/2001 | Kubo et al. |
| 2002/0025790 A1 | 2/2002 | Matsuoka |
| 2002/0034260 A1 | 3/2002 | Kim |
| 2002/0041208 A1 | 4/2002 | Hamada et al. |
| 2002/0041209 A1* | 4/2002 | Miyatani ............... H03F 1/3288 330/149 |
| 2002/0044014 A1 | 4/2002 | Wright et al. |
| 2002/0080891 A1 | 6/2002 | Ahn et al. |
| 2002/0097085 A1 | 7/2002 | Stapleton |
| 2002/0101937 A1 | 8/2002 | Antonio et al. |
| 2002/0101938 A1 | 8/2002 | Horaguchi et al. |
| 2002/0158689 A1 | 10/2002 | Harris et al. |
| 2002/0179830 A1 | 12/2002 | Pearson et al. |
| 2002/0186783 A1 | 12/2002 | Opas et al. |
| 2002/0187761 A1 | 12/2002 | Im et al. |
| 2002/0191710 A1 | 12/2002 | Jeckeln et al. |
| 2002/0193085 A1 | 12/2002 | Mathe et al. |
| 2002/0193087 A1 | 12/2002 | Kim |
| 2003/0035494 A1 | 2/2003 | Bauder et al. |
| 2003/0058959 A1 | 3/2003 | Rafie et al. |
| 2003/0095608 A1 | 5/2003 | Duperray |
| 2003/0098752 A1 | 5/2003 | Haghighat |
| 2003/0104792 A1 | 6/2003 | Doi |
| 2003/0112068 A1 | 6/2003 | Kenington |
| 2003/0146787 A1 | 8/2003 | Hedberg et al. |
| 2003/0179829 A1 | 9/2003 | Pinckley et al. |
| 2003/0179830 A1 | 9/2003 | Eidson et al. |
| 2003/0207680 A1 | 11/2003 | Yang et al. |
| 2003/0227981 A1 | 12/2003 | Vella-Coleiro et al. |
| 2003/0228856 A1 | 12/2003 | Orihashi et al. |
| 2003/0234688 A1 | 12/2003 | Matsuyoshi et al. |
| 2004/0017859 A1 | 1/2004 | Sills et al. |
| 2004/0032912 A1 | 2/2004 | Ocenasek et al. |
| 2004/0105509 A1 | 6/2004 | McGowan et al. |
| 2004/0136470 A1 | 7/2004 | DeBruyn et al. |
| 2004/0142667 A1 | 7/2004 | Lohhead et al. |
| 2004/0179587 A1 | 9/2004 | Kenington et al. |
| 2004/0180634 A1 | 9/2004 | Kenington et al. |
| 2004/0203542 A1 | 10/2004 | Seo et al. |
| 2004/0208259 A1 | 10/2004 | Hunton |
| 2004/0212428 A1 | 10/2004 | Ode et al. |
| 2004/0240585 A1 | 12/2004 | Bishop et al. |
| 2004/0247042 A1 | 12/2004 | Sahlman |
| 2005/0008096 A1 | 1/2005 | Iwasaki et al. |
| 2005/0059360 A1 | 3/2005 | Kenington |
| 2005/0068102 A1 | 3/2005 | Hongo et al. |
| 2005/0079834 A1 | 4/2005 | Maniwa et al. |
| 2005/0157814 A1 | 7/2005 | Cova et al. |
| 2005/0159117 A1 | 7/2005 | Bausov et al. |
| 2005/0164667 A1 | 7/2005 | Pan et al. |
| 2005/0180526 A1 | 8/2005 | Kim et al. |
| 2005/0180527 A1 | 8/2005 | Suzuki et al. |
| 2005/0190857 A1 | 9/2005 | Braithwaite |
| 2005/0195919 A1 | 9/2005 | Cova |
| 2005/0226346 A1 | 10/2005 | Ode et al. |
| 2005/0253652 A1 | 11/2005 | Song et al. |
| 2005/0258898 A1 | 11/2005 | Hongo |
| 2005/0262498 A1 | 11/2005 | Ferguson et al. |
| 2006/0012426 A1 | 1/2006 | Nezami |
| 2006/0012427 A1 | 1/2006 | Nezami |
| 2006/0067426 A1 | 3/2006 | Maltsev et al. |
| 2006/0109052 A1 | 5/2006 | Saed et al. |
| 2006/0121858 A1 | 6/2006 | Tanaka et al. |
| 2006/0141957 A1 | 6/2006 | Fischer et al. |
| 2006/0214729 A1 | 9/2006 | Furuya et al. |
| 2006/0217083 A1 | 9/2006 | Braithwaite |
| 2006/0226903 A1 | 10/2006 | Muller et al. |
| 2006/0238245 A1 | 10/2006 | Carichner et al. |
| 2006/0240786 A1 | 10/2006 | Liu |
| 2006/0262880 A1 | 11/2006 | Mizuta et al. |
| 2006/0270366 A1 | 11/2006 | Rozenblit et al. |
| 2006/0276147 A1 | 12/2006 | Suzuki et al. |
| 2007/0057737 A1 | 3/2007 | Davis et al. |
| 2007/0075780 A1 | 4/2007 | Krvavac et al. |
| 2007/0135065 A1 | 6/2007 | Leffel et al. |
| 2007/0171234 A1 | 7/2007 | Crawfis et al. |
| 2007/0190952 A1 | 8/2007 | Waheed et al. |
| 2007/0241812 A1 | 10/2007 | Yang et al. |
| 2007/0264947 A1 | 11/2007 | Rozenblit et al. |
| 2007/0273439 A1 | 11/2007 | Lin et al. |
| 2007/0296494 A1 | 12/2007 | Hongo |
| 2008/0031380 A1 | 2/2008 | Takabayashi |
| 2008/0068191 A1 | 3/2008 | Maeda et al. |
| 2008/0094139 A1 | 4/2008 | Takano et al. |
| 2008/0139140 A1 | 6/2008 | Matero et al. |
| 2008/0152037 A1 | 6/2008 | Kim et al. |
| 2008/0240286 A1 | 10/2008 | Zhang et al. |
| 2008/0265996 A1 | 10/2008 | Kim et al. |
| 2009/0013317 A1 | 1/2009 | Abfalter et al. |

(56) References Cited

U.S. PATENT DOCUMENTS

| | | |
|---|---|---|
| 2009/0088093 A1 | 4/2009 | Nentwig |
| 2009/0146736 A1 | 6/2009 | Kim et al. |
| 2009/0213972 A1 | 8/2009 | Maunuksela et al. |
| 2012/0147993 A1 | 6/2012 | Kim et al. |
| 2012/0230382 A1 | 9/2012 | Kim et al. |
| 2013/0214861 A1 | 8/2013 | Kim et al. |
| 2013/0315291 A1 | 11/2013 | Kim et al. |
| 2014/0327481 A1 | 11/2014 | Kim et al. |
| 2017/0033969 A1 | 2/2017 | Yang et al. |
| 2018/0102747 A1 | 4/2018 | Kim et al. |
| 2018/0279197 A1 | 9/2018 | Kim et al. |
| 2019/0288900 A1 | 9/2019 | Yang et al. |
| 2020/0083914 A1 | 3/2020 | Yang et al. |
| 2020/0136567 A1 | 4/2020 | Kim et al. |
| 2020/0313631 A1 | 10/2020 | Yang et al. |

FOREIGN PATENT DOCUMENTS

| | | |
|---|---|---|
| CN | 1349679 A | 5/2002 |
| CN | 1462153 A | 12/2003 |
| CN | 1518209 A | 8/2004 |
| CN | 1531213 | 9/2004 |
| CN | 1578119 A | 2/2005 |
| CN | 1605152 A | 4/2005 |
| CN | 1640086 A | 7/2005 |
| CN | 1700591 A | 11/2005 |
| CN | 1838530 A | 6/2006 |
| CN | 1866731 A | 11/2006 |
| CN | 1983801 A | 6/2007 |
| CN | 102460385 A | 5/2012 |
| CN | 101720528 B | 3/2014 |
| CN | 104202279 A | 12/2014 |
| EP | 1798853 A | 6/2007 |
| EP | 2 430 531 A1 | 3/2012 |
| IN | 8527/CHENP/2011 A | 3/2013 |
| JP | H09-284149 A | 10/1997 |
| JP | H09284149 A | 10/1997 |
| JP | 2000-092412 A | 3/2000 |
| JP | 2000-512107 A | 9/2000 |
| JP | 2000-278237 A | 10/2000 |
| JP | 2001-268032 A | 6/2001 |
| JP | 2001-508954 A | 7/2001 |
| JP | 2001-217885 | 8/2001 |
| JP | 2001-244757 A | 9/2001 |
| JP | 2002-536902 A | 10/2002 |
| JP | 2003-168931 A | 6/2003 |
| JP | 2003-304122 A | 10/2003 |
| JP | 2004-015364 A | 1/2004 |
| JP | 2005-020675 A | 1/2005 |
| JP | 2005-033632 A | 2/2005 |
| JP | 2005-101908 A | 4/2005 |
| JP | 2005-150932 A | 6/2005 |
| JP | 2005-217714 A | 8/2005 |
| JP | 2005-333353 A | 12/2005 |
| JP | 2006-505160 A | 2/2006 |
| JP | 2006-340166 A | 12/2006 |
| JP | 2007-020157 A | 1/2007 |
| JP | 2007-104018 A | 4/2007 |
| JP | 2007-195056 A | 8/2007 |
| JP | 2009-038688 A | 2/2009 |
| JP | 2010-525758 A | 7/2010 |
| JP | 2012-525093 A | 10/2012 |
| KR | 10-2000-0016621 | 3/2000 |
| KR | 2000-0039780 | 7/2000 |
| KR | 10-2004-0054420 | 6/2004 |
| KR | 10-2005-0006725 | 1/2005 |
| KR | 10-2005-0052556 | 6/2005 |
| KR | 10-2006-0109997 A | 10/2006 |
| KR | 10-2010-017270 A | 2/2010 |
| TW | 261419 B | 9/2006 |
| WO | WO 97/48181 | 12/1997 |
| WO | WO 00/46916 | 8/2000 |
| WO | WO 01/08296 | 2/2001 |
| WO | WO 2004/040870 | 5/2004 |
| WO | WO 2005/076495 | 8/2005 |
| WO | WO 2006/025213 | 3/2006 |
| WO | WO 2006/087864 | 8/2006 |
| WO | WO 2006/102278 | 9/2006 |
| WO | WO 2007/004252 | 1/2007 |
| WO | WO 2008/078195 | 7/2008 |
| WO | WO 2008/105775 | 9/2008 |
| WO | WO 2008/154077 | 12/2008 |
| WO | WO 2008/155610 | 12/2008 |
| WO | WO 2009/109808 | 9/2009 |
| WO | WO 2010/124297 | 10/2010 |

OTHER PUBLICATIONS

U.S. Appl. No. 60/295,577, filed Apr. 23, 2017, Cho et al.
U.S. Appl. No. 60/925,603, filed Apr. 23, 2017, Kim et al.
U.S. Appl. No. 60/969,127, filed Aug. 30, 2007, Liu et al.
U.S. Appl. No. 60/969,131, filed Aug. 30, 2007, Liu et al.
U.S. Appl. No. 61/041,164, filed Mar. 31, 2008, Kim et al.
Armstrong, J. Abstract for "Peak-to-Average Power Reduction for OFDM by Repeated Clipping and Frequency Domain Filtering" IEEE Electronics Letters; vol. 38, Issue 5; Feb. 2002.
Bernardini, A, et al. "Analysis of Different Optimization Criteria for IF Predistortion in Digital Radio Links with Nonlinear Amplifiers" IEEE Transactions on Communications; vol. 45, Issue 4; Apr. 1997.
Cavers, J.K. "Adaptive Behaviour of a Feedforward Amplifer Linearizer" IEEE Transactions on Vehicular Technology; vol. 44, No. 1; Feb. 1995.
Cavers, J.K. "Amplifier Linearization Using Digital Predistorter with Fast Adaptation and Low Memory Requirements" IEEE Transactions on Vehicular Technology; vol. 39, Issue 4; Nov. 1990.
Ding, Lei et al. "A Hammerstein Predistortion Linearization Design Based on The Indirect Learning Architecture" IEEE Int'l Conf. on Acoustics, Speech, and Signal Processing, vol. 3; 2002.
Ding, Lei "Digital Predistortion of Power Amplifiers for Wireless Applications" School of Electrical and Computer Engineering Georgia Institute of Technology; Mar. 2004.
Eun, Changsoo et al. "A New Volterra Predistorter Based on the Indirect Learning Architecture" IEEE Transactions on Signal Processing, vol. 45, No. 1, Jan. 1997.
Falukner, M., et al. "Adaptive Linearization Using Predistortion—Experimental Results" IEEE Transactions on Vehicular Technology; vol. 43, Issue 2; May 1994.
Hilborn, Derek S. et al. "An Adaptive Direct Conversion Transmitter" IEEE Transactions on Vehicular Technology; vol. 43, No. 2, May 1994.
Kim, W.J., et al. "Baseband Derived RF Digital Predistortion" Electronic Letters; vol. 42, No. 8; Apr. 13, 2006.
Kim, Wan-Jong "Digital Predistortion Linearization and Crest Factor Reduction for Wideband Applications" 2006.
Kim, Wan-Jong et al. "Digital Predistortion Linearizes Wireless Power Amplifiers" IEEE Microwave Magazine, vol. 8, Issue 3, Sep. 2005.
Kim, Wan-Jong et al. Abstract for "Digital Predistortion of a Doherty Amplifier With a Weak Memory within a Connected Solution" IEEE 60th Vehicular Technology Conference, vol. 3, Sep. 2004.
Kim, Wan-Jong, et al. "Piecewise Pre-Equalized Linearization of the Wireless Transmitter with a Doherty Amplifier" IEEE Transactions on Microwave Theory and Techniques; vol. 54, No. 9; Sep. 2006.
Leung, S.H., et al. Abstract for "Algorithm for Repeated Clipping and Filtering in Peak-to-Average Power Reduction for OFDM" IEEE Electronic Letters; vol. 38; Issue 25; Dec. 5, 2002.
Mekechuk, Kelly et al. "Linearizing Power Amplifiers Using Digital Predistortion, EDA tools and Test Hardware" High Frequency Electronics; Apr. 2004.
Nagata. Y. et al. "Linear Amplification Technique for Digital Mobile Communications" IEEE 39th Vehicular Technology Conference; May 1989.
Santella, G "Performance of Adaptive Predistorters in Presence of Othogonal Multicarrier Modulation" International Conference on Telecornmunicaitons, Apr. 1997.

(56) References Cited

OTHER PUBLICATIONS

Stapleton, Shawn et al. "An Adaptive Predistorter for a Power Amplifier Based on Adjacent Channel Emissions" IEEE Transactions on Vehicular Technology; vol. 41, Issue 1; Feb. 1992.
Väänänen, Olli et al. "Effect of Clipping in Wideband CDMA System and Simple Algorithm for Peak Windowing" World Wireless Congress, San Francisco; May 2002.
Yang, Y., et al. Abstract for "A Fully Matched N-Way Doherty Amplifier with Optimized Linearity" IEEE Trans. Microwave Theory Tech., vol. 51, No. 3; Mar. 2005.
International Search Report for International Application No. PCT/US2007/010566, dated Apr. 18, 2008.
Written Opinion for International Application No. PCT/US2007/010566, dated Apr. 18, 2008.
International Preliminary Report on Patentability for International Application No. PCT/US2007/010566, dated Oct. 28, 2008.
First Office Action (Including Translation) for Chinese Application No. 200780023875.1, dated Dec. 23, 2011.
Second Office Action (Including Translation) for Chinese Application No. 200780023875.1, dated Oct. 16, 2012.
European Search Report for European Patent Application No. 07861302.3, dated Nov. 25, 2009.
International Search Report for International Application No. PCT/US2008/061355, dated Aug. 4, 2008.
Written Opinion for International Application No. PCT/US2008/061355, dated Aug. 4, 2008.
International Preliminary Report on Patentability for International Application No. PCT/US2008/061355, dated Oct. 27, 2009.
First Office Action (Including Translation) for Chinese Application No. 200880021049.8, dated Mar. 28, 2012.
Second Office Action (Including Translation) for Chinese Application No. 200880021049.8, dated Dec. 4, 2012.
Third Office Action (Including Translation) for Chinese Application No. 200880021049.8, dated Jun. 20, 2013.
European Search Report for European Application No. 08746721.3, dated Apr. 9, 2014.
Intention to Grant for European Application No. 08746721.3, dated Mar. 5, 2018.
Examination Report for Indian Patent Application No. 7544/DELNP/2009, dated Apr. 3, 2017.
Intent to Grant for Indian Patent Application No. 7544/DELNP/2009, dated Feb. 3, 2020.
Notice of Reasons for Rejection (Including Translation) for Japanese Patent Application No. 2010-506483, dated Jan. 10, 2012.
Notice of Reasons for Rejection (Including Translation) for Japanese Patent Application No. 2010-506483, dated Oct. 9, 2012.
Dismissal Decision for Amendment (Including Translation) for Rejection for Japanese Patent Application No. 2010-506483, dated Jun. 4, 2013.
Final Notice of Reasons for Rejection (Including Translation) for Japanese Patent Application No. 2010-506483, dated Dec. 17, 2013.
Decision to Grant (Including Translation) for Japanese Patent Application No. 2010-506483, dated Jul. 1, 2014.
Notification of Reason for Refusal (Including Translation) for Korean Application No. 10-2009-7024361, dated Apr. 29, 2014.
Grant of Patent (Including Translation) for Korean Application No. 10-2009-7024361, dated Dec. 22, 2014.
Notification of Reason for Refusal (Including Translation) for Korean Application No. 10-2014-7021366, dated Sep. 30, 2014.
Notification of Reason for Refusal (Including Translation) for Korean Application No. 10-2014-7021366, dated Jun. 28, 2015.
Notification of Reason for Refusal (Including Translation) for Korean Application No. 10-2014-7021366, dated Jan. 7, 2016.
Notice of Allowance (Including Translation) for Korean Application No. 10-2014-7021366, dated Sep. 27, 2016.
International Search Report for International Application No. PCT/IB2008/000996, dated Feb. 26, 2009.
Written Opinion for International Application No. PCT/IB2008/000996, dated Feb. 26, 2009.
International Preliminary Report on Patentability for International Application No. PCT/IB2008/000996, dated Jul. 28, 2009.
First Office Action (Including Translation) for Chinese Application No. 200880003130.3, dated Aug. 5, 2011.
Second Office Action (Including Translation) for Chinese Application No. 200880003130.3, dated May 3, 2012.
Third Office Action (Including Translation) for Chinese Application No. 200880003130.3, dated Jan. 11, 2013.
Fourth Office Action (Including Translation) for Chinese Application No. 200880003130.3, dated Jul. 8, 2013.
Fifth Office Action (Including Translation) for Chinese Application No. 200880003130.3, dated Dec. 24, 2013.
First Office Action (Including Translation) for Chinese Application No. 201410199319.1, dated Jul. 4, 2016.
Second Office Action (Including Translation) for Chinese Application No. 201410199319.1, dated May 18, 2017.
Third Office Action (Including Translation) for Chinese Application No. 201410199319.1, dated Jan. 31, 2018.
Notification to Grant Patent Right for Invention (Including Translation) for Chinese Application No. 201410199319.1, dated Jul. 5, 2018.
European Search Report for European Application No. 08806836.6, dated Dec. 30, 2009.
International Search Report for International Application No. PCT/IB2007/004404, dated Sep. 19, 2008.
Written Opinion for International Application No. PCT/IB2007/004404, dated Sep. 19, 2008.
International Preliminary Report on Patentability for International Application No. PCT/IB2007/004404, dated Feb. 1, 2011.
Translation of First Office Action for Chinese Application No. 200780051434.2, dated Mar. 6, 2013.
Second Office Action (Including Translation) for Chinese Application No. 200780051434.2, dated Jan. 2, 2014.
First Office Action (Including Translation) for Chinese Application No. 201410462933.2, dated Dec. 16, 2016.
Second Office Action (Including Translation) for Chinese Application No. 201410462933.2, dated Aug. 30, 2017.
Third Office Action for Chinese Application No. 201410462933.2, dated Apr. 17, 2018.
Rejection Decision for Chinese Application No. 201410462933.2, dated Mar. 15, 2019.
First Board Opinion for Chinese Application No. 201410462933.2, dated Oct. 30, 2019.
Second Board Opinion (Including Translation) for Chinese Application No. 201410462933.2, dated Apr. 27, 2020.
Board Decision (Including Translation) for Chinese Application No. 201410462933.2, dated Sep. 28, 2020.
European Search Report for European Application No. 07870441.8, dated Feb. 26, 2014.
Intent to Grant for European Application No. 07870441.8, dated Mar. 1, 2018.
European Search Report for European Application No. 18187871.1, dated Oct. 12, 2018.
Intention to Grant for European Application No. 18187871.1, dated Apr. 29, 2020.
Examination Report for Indian Patent Application No. 4344/CHENP/2009, dated Jul. 14, 2014.
Notice of Grant for Indian Patent Application No. 4344/CHENP/2009, dated Jun. 5, 2017.
Notice of Reasons for Refusal for (Including Translation) Japanese Patent Application No. 2009-543544, dated May 8, 2012.
Notice of Reasons for Refusal (Including Translation) for Japanese Patent Application No. 2009-543544, dated Aug. 21, 2012.
Notice of Reasons for Refusal (Including Translation) for Japanese Patent Application No. 2009-543544, dated Nov. 13, 2012.
Notice of Allowance (Including Translation) for Japanese Patent Application No. 2009-543544, dated Mar. 12, 2013.
Notification of Reason for Refusal (Including Translation) for Korean Application No. 10-2009-7015697, dated Apr. 28, 2014.
Notification of Reason for Refusal (Including Translation) for Korean Application No. 10-2009-7015697, dated Oct. 17, 2014.
Notification of Reason for Refusal (Including Translation) for Korean Application No. 10-2009-7015697, dated May 22, 2015.

(56) References Cited

OTHER PUBLICATIONS

Notification of Final Rejection (Including Translation) for Korean Application No. 10-2009-7015697, dated Jul. 27, 2015.
Notification of Reason for Refusal (Including Translation) for Korean Application No. 10-2014-7017682, dated Aug. 26, 2014.
Notification of Final Rejection (Including Translation) for Korean Application No. 10-2014-7017682, dated May 28, 2015.
International Search Report for International Application No. PCT/IB2008/003944, dated Sep. 18, 2009.
Written Opinion for International Application No. PCT/IB2008/003944, dated Sep. 18, 2009.
International Preliminary Report on Patentability for International Application No. PCT/IB2008/003944, dated Mar. 22, 2011.
First Office Action (Including Translation) for Chinese Patent Application No. 2008801263242, dated May 29, 2013.
Second Office Action (Including Translation) for Chinese Patent Application No. 2008801263242, dated Apr. 11, 2014.
Notification to Grant Patent Right for Invention (Including Translation) Chinese Patent Application No. 200880126324.2, dated Aug. 10, 2016.
European Search Report for European Application No. 08873193.0, dated Apr. 29, 2014.
Office Action for European Application No. 08873193.0, dated Feb. 28, 2018.
Office Action for European Application No. 08873193.0, dated Dec. 12. 2018.
Examination Report for Indian Patent Application No. 4196/CHENP/2010, dated Sep. 26, 2017.
Decision on Hearing for Indian Patent Application No. 4196/CHENP/2010, dated Dec. 26, 2019.
Notice of Reasons for Refusal (Including Translation) for Japanese Patent Application No. 2010-536550, dated Aug. 7, 2012.
Decision to Grant a Patent (Including Translation) for Japanese Patent Application No. 2010-536550, dated Apr. 2, 2013.
Notification of Reason for Refusal (Including Translation) for Korean Application No. 10-2010-7015019, dated Oct. 24, 2014.
Notification of Reason for Refusal (Including Translation) for Korean Application No. 10-2010-7015019, dated May 26, 2015.
Notice of Allowance (Including Translation) for Korean Application No. 10-2010-7015019, dated Jan. 21, 2016.
International Search Report for International Application No. PCT/US2010/032453, dated Jun. 28, 2010.
Written Opinion for International Application No. PCT/US2010/032453, dated Jun. 28, 2010.
International Preliminary Report on Patentability for International Application No. PCT/US2010/032453, dated Nov. 3, 2011.
First Office Action (Including Translation) for Chinese Application No. 201080025887.X, dated Nov. 22, 2013.
Second Office Action (Including Translation) for Chinese Application No. 201080025887.X, dated May 29, 2014.
Third Office Action (Including Translation) for Chinese Application No. 201080025887.X, dated Dec. 2, 2014.
Fourth Office Action (Including Translation) for Chinese Application No. 201080025887.X, dated Jun. 2, 2015.
Notification to Grant Patent Right for Invention (Including Translation) for Chinese Application No. 201080025887.X, dated Nov. 17, 2015.
European Search Report for European Application No. 10767899.7, dated Mar. 14, 2013.
Office Action for European Application No. 10767899.7, dated Jun. 2, 2015.
Office Action for European Application No. 10767899.7, dated Feb. 5, 2018.
Intention to Grant for European Application No. 10767899.7, dated Dec. 6, 2018.
Intention to Grant for European Application No. 10767899.7, dated Jun. 27, 2019.
Substantive Examination Report for Indonesian Application No. W00201201448, dated Sep. 2, 2016.
Examination Report for Indian Patent Application No. 8527/CHENP/2011, dated Nov. 28, 2019.
Notice of Reasons for Rejection (Including Translation) for Japanese Patent Application No. 2012-507473, dated Feb. 25, 2014.
Notice of Reasons for Rejection (Including Translation) for Japanese Patent Application No. 2012-507473, dated Dec. 2, 2014.
Decision of Refusal (Including Translation) for Japanese Patent Application No. 2012-507473, dated May 12, 2015.
Notice o' Reasons for Rejection (Including Translation) for Japanese Patent Application No. 2015-178686, dated Sep. 27, 2016.
Decision of Refusal (Including Translation)for Japanese Patent Application No. 2015-178686, dated Aug. 28, 2017.
Notice of Reasons for Rejection (Including Translation) for Japanese Patent Application No. 2017-253609, dated Mar. 8, 2019.
Decision of Refusal (Including Translation) for Japanese Patent Application No. 2017-253609, dated Nov. 5, 2019.
Notification of Reasons for Refusal (Including Translation) for Korean Application No. 10-2011-7027891, dated Jul. 14, 2016.
Notification of Reasons for Refusal (Including Translation) for Korean Application No. 10-2011-7027891, dated Apr. 21, 2017.
Notification of Reasons for Refusal (Including Translation) for Korean Application No. 10-2011-7027891, dated Feb. 26, 2018.
Notification of Reasons for Refusal (Including Translation) for Korean Application No. 10-2011-7027891, dated Oct. 4, 2018.
Notice of Allowance (Including Translation) for Korean Application No. 10-2011-7027891, dated Jan. 4, 2019.
Office Action for U.S. Appl. No. 10/137,556, dated Dec. 2, 2004.
Notice of Allowance for U.S. Appl. No. 10/137,556, dated Jul. 6, 2005.
Office Action for U.S. Appl. No. 11/262,079 dated Aug. 29, 2008.
Office Action for U.S. Appl. No. 11/262,079 dated May 4, 2009.
Office Action for U.S. Appl. No. 11/262,079 dated Dec. 11, 2009.
Office Action for U.S. Appl. No. 11/262,079 dated Aug. 25, 2010.
Office Action for U.S. Appl. No. 11/262,079 dated Mar. 26, 2012.
Notice of Allowance for U.S. Appl. No. 11/262,079 dated Aug. 23, 2012.
Office Action for U.S. Appl. No. 13/619,538, dated Sep. 18, 2013.
Notice of Allowance for U.S. Appl. No. 13/619,538, dated Dec. 31, 2013.
Office Action for U.S. Appl. No. 14/245,190, dated Aug. 18, 2014.
Notice of Allowance for U.S. Appl. No. 14/245,190, dated Jan. 14, 2015.
Office Action for U.S. Appl. No. 14/684,678, dated Aug. 28, 2015.
Notice of Allowance for U.S. Appl. No. 14/684,678, dated Feb. 22, 2016.
Office Action for U.S. Appl. No. 15/173,887, dated Dec. 2, 2016.
Office Action for U.S. Appl. No. 15/173,887, dated Aug. 7, 2017.
Office Action for U.S. Appl. No. 15/173,887, dated Jan. 24, 2018.
Office Action for U.S. Appl. No. 15/173,887, dated Jul. 26, 2018.
Office Action for U.S. Appl. No. 16/230,750, dated Sep. 20, 2019.
Office Action for U.S. Appl. No. 16/230,750, dated Jun. 8, 2020.
Notice of Allowance for U.S. Appl. No. 16/230,750, dated Dec. 14, 2020.
Office Action for U.S. Appl. No. 11/799,239, dated Oct. 29, 2009.
Office Action for U.S. Appl. No. 11/799,239, dated Jun. 24, 2010.
Notice of Allowance for U.S. Appl. No. 11/799,239, dated Sep. 22, 2011.
Office Action for U.S. Appl. No. 13/301,224, dated May 24. 2012.
Office Action for U.S. Appl. No. 13/301,224, dated Oct. 25, 2012.
Office Action for U.S. Appl. No. 13/301,224, dated Apr. 2, 2013.
Notice of Allowance for U.S. Appl. No. 13/301,224, dated Aug. 30, 2013.
Office Action for U.S. Appl. No. 14/095,891, dated Jun. 10, 2014.
Notice of Allowance for U.S. Appl. No. 14/095,891, dated Jan. 21, 2015.
Office Action for U.S. Appl. No. 14/691,152, dated Apr. 25, 2016.
Notice of Allowance for U.S. Appl. No. 14/691,152, dated Janaury 6, 2017.
Notice of Allowance for U.S. Appl. No. 14/691,152, dated Apr. 19, 2017.
Office Action for U.S. Appl. No. 15/682,431, dated Mar. 12, 2018.
Notice of Allowance for U.S. Appl. No. 15/682,431, dated Jan. 18, 2019.

(56) References Cited

OTHER PUBLICATIONS

Office Action for U.S. Appl. No. 16/388,680, dated Jan. 27, 2020.
Office Action for U.S. Appl. No. 16/388,680, dated Jun. 9, 2020.
Office Action for U.S. Appl. No. 16/388,680, dated Oct. 30, 2020, 2020.
Office Action for U.S. Appl. No. 12/021,241, dated Apr. 15, 2009.
Office Action for U.S. Appl. No. 12/021,241, dated Dec. 18, 2009.
Office Action for U.S. Appl. No. 12/021,241, dated Sep. 21, 2010.
Office Action for U.S. Appl. No. 12/021,241, dated Feb. 15, 2012.
Notice of Allowance for U.S. Appl. No. 12/021,241, dated Sep. 25, 2012.
Office Action for U.S. Appl. No. 13/724,157, dated Oct. 10, 2014.
Notice of Allowance for U.S. Appl. No. 13/724,157, dated Mar. 10, 2015.
Office Action for U.S. Appl. No. 14/788,567, dated Dec. 3, 2015.
Office Action for U.S. Appl. No. 14/788,567, dated Jun. 3, 2016.
Office Action for U.S. Appl. No. 14/788,567, dated Nov. 22, 2016.
Office Action for U.S. Appl. No. 14/788,567, dated May 31, 2017.
Office Action for U.S. Appl. No. 14/788,567, dated Nov. 9, 2017.
Notice of Allowance for U.S. Appl. No. 14/788,567, dated May 31, 2018.
Office Action for U.S. Appl. No. 16/118,329, dated Mar. 28, 2019.
Office Action for U.S. Appl. No. 16/118,329, dated Oct. 10, 2019.
Notice of Allowance for U.S. Appl. No. 16/118,329, dated Feb. 18, 2020.
Office Action for U.S. Appl. No. 16/901,116, dated Sep. 22, 2020.
Office Action for U.S. Appl. No. 12/108,502 dated Jul. 23, 2009.
Office Action for U.S. Appl. No. 12/108,502 dated Apr. 14, 2010.
Office Action for U.S. Appl. No. 12/108,502 dated Dec. 20, 2010.
Office Action for U.S. Appl. No. 12/108,502 dated Sep. 23, 2011.
Notice of Allowance for U.S. Appl. No. 12/108,502 dated Feb. 6, 2014.
Notice of Allowance for U.S. Appl. No. 12/108,502 dated Jul. 18, 2014.
Office Action for U.S. Appl. No. 14/271,881, dated Jul. 28, 2016.
Notice of Allowance for U.S. Appl. No. 14/271,881, dated Apr. 27, 2017.
Office Action for U.S. Appl. No. 15/684,580, dated Apr. 3, 2019.
Office Action for U.S. Appl. No. 12/767,669, dated Aug. 4, 2011.
Office Action for U.S. Appl. No. 12/767,669, dated Jan. 30, 2012.
Office Action for U.S. Appl. No. 12/767,669, dated Oct. 12, 2012.
Office Action for U.S. Appl. No. 12/767,669, dated May 9, 2013.
Office Action for U.S. Appl. No. 12/767,669, dated Oct. 29, 2013.
Office Action for U.S. Appl. No. 12/767,669, dated May 23, 2014.
Notice of Allowance for U.S. Appl. No. 12/767,669, dated Jan. 5, 2015.
Office Action for U.S. Appl. No. 11/962,025, dated Jul. 9, 2010.
Office Action for U.S. Appl. No. 11/962,025, dated Feb. 16. 2011.
Office Action for U.S. Appl. No. 11/962,025, dated May 24, 2012.
Office Action for U.S. Appl. No. 11/962,025, dated Sep. 28, 2012.
Notice of Allowance for U.S. Appl. No. 11/962,025, dated Feb. 8, 2013.
Office Action for U.S. Appl. No. 11/961,969, dated Sep. 23, 2010.
Office Action for U.S. Appl. No. 11/961,969, dated May 10. 2011.
Notice of Allowance for U.S. Appl. No. 11/961,969, dated Nov. 25, 2011.
Office Action for U.S. Appl. No. 13/404,679, dated Aug. 28, 2012.
Notice of Allowance for U.S. Appl. No. 13/404,679, dated Feb. 5, 2013.
Office Action for U.S. Appl. No. 13/887,133, dated Nov. 7, 2013.
Notice of Allowance for U.S. Appl. No. 13/887,133, dated Jun. 6, 2014.
Office Action for U.S. Appl. No. 14/480,285, dated Jan. 30, 2015.
Notice of Allowance for U.S. Appl. No. 14/480,285, dated Sep. 16, 2015.
Office Action for U.S. Appl. No. 14/991,264 dated Jun. 30, 2016.
Office Action for U.S. Appl. No. 14/991,264 dated Apr. 28, 2017.
Notice of Allowance for U.S. Appl. No. 14/991,264 dated Oct. 19, 2017.
Office Action for U.S. Appl. No. 15/875,936 dated Oct. 5, 2018.
Office Action for U.S. Appl. No. 15/875,936 dated Apr. 2, 2019.
Extended European Search Report for application No. 20196761.9 dated Dec. 23, 2020.

\* cited by examiner

| PD type | ACPR (Lower) | ACPR (Upper) |
|---|---|---|
| No PD | -40.4 dBc | -38.7 dBc |
| LUT | -56.4 dBc | -54.5 dBc |
| Hammerstein | -56.7 dBc | -54.2 dBc |
| The proposed | -65.1 dBc | -64.4 dBc |
| Memory Polynomial | -66.2 dBc | -65.1 dBc |

| PD type | ACPR (Lower) | ACPR (Upper) |
|---|---|---|
| No PD | -35.4 dBc | -36.4 dBc |
| LUT | -45.4 dBc | -47.5 dBc |
| Hammerstein | -45.5 dBc | -48.8 dBc |
| The proposed | -51.1 dBc | -53.4 dBc |
| Memory Polynomial | -52.2 dBc | -54.1 dBc |

| Method | | The proposed |
|---|---|---|
| LUT PD output | ADD/SUB | 2 |
| | MPY | 4 |
| | Memory size (LUT) | 2N |
| 1 Iteration | ADD/SUB | 16 |
| | MPY | 20 |
| | Memory size | - |
| Filtering | ADD/SUB | 4L-2 |
| | MPY | 4L |
| | Memory size | 2L |
| Filter Update | ADD/SUB | 8L |
| | MPY | 8L+2 |
| | Memory size | (2N+1)L |
| Total Operations | | 12L+16 : ADD/SUB<br>14L+26 : MPY<br>2NL+3L+2N : Memory size |

N is the number of LUT entries and L is the number of taps.

FIGURE 9

| Method | | Memory polynomial |
|---|---|---|
| PT output | ADD/SUB | $4O+K-1$ |
| | MPY | $6O$ |
| | Memory size | $2K$ |
| 1 Iteration | ADD/SUB | $12O^2+10O+K+1$ |
| | MPY | $14O^2+18O+4$ |
| | Memory size | $2O+2$ |
| Total Operations | | $12O^2+14O+2K$ : ADD/SUB<br>$14O^2+24O+4$ : MPY<br>$2O+2K+2$ : Memory size |

O is equal to P(K+1), where P is the polynomial order and K is the number of memory terms

FIGURE 10

METHOD AND SYSTEM FOR BASEBAND PREDISTORTION LINEARIZATION IN MULTI-CHANNEL WIDEBAND COMMUNICATION SYSTEMS

CROSS-REFERENCES TO RELATED APPLICATIONS

The present application is a continuation of U.S. patent application Ser. No. 15/875,936, filed Jan. 19, 2018, which is a continuation of U.S. patent application Ser. No. 14/991,264, filed Jan. 8, 2016, now U.S. Pat. No. 9,913,194, which is a continuation of U.S. patent application Ser. No. 14/480,285, filed on Sep. 8, 2014, now U.S. Pat. No. 9,246,731, which is a continuation of Ser. No. 13/887,133, filed on May 3, 2013, now U.S. Pat. No. 8,855,234, which is a continuation of U.S. patent application Ser. No. 13/404,679, filed on Feb. 24, 2012, now U.S. Pat. No. 8,509,347, which is a continuation of U.S. patent application Ser. No. 11/961,969, filed on Dec. 20, 2007, now U.S. Pat. No. 8,149,950, which claims the benefit under 35 U.S.C. § 119(e) of U.S. Provisional Patent Application No. 60/877,035, filed Dec. 26, 2006, and U.S. Provisional Patent Application No. 61/012,416, filed Dec. 7, 2007, the contents of which are hereby incorporated by reference in their entirety.

BACKGROUND OF THE INVENTION

The linearity and efficiency of radio frequency (RF) power amplifiers (PAs) have been a critical design issue for non-constant envelope digital modulation schemes which have high peak-to-average-power ratios (PARs) as the importance of spectral efficiency in wireless communication systems increases. RF Pas have nonlinearities that generate amplitude modulation-amplitude modulation (AM-AM) and amplitude modulation-phase modulation (AM-PM) distortion at the output of the PA. These effects create spectral regrowth in the adjacent channels and in-band distortion which degrades the error vector magnitude (EVM).

The relationship between linearity and efficiency is a tradeoff since power efficiency is very low when the amplifier operates in its linear region and increases as the amplifier is driven into its compression region. In order to enhance linearity and efficiency at the same time, linearization techniques are typically applied to the RF PAs. Various linearization techniques have been proposed such as feedback, feedforward and predistortion.

One technique is baseband digital predistortion (PD) which typically uses a digital signal processor. Digital predistortion can achieve improved linearity and improved power efficiency with reduced system complexity when compared to the widely used conventional feedforward linearization technique. A software implementation provides the digital predistorter with re-configurability suitable for multi-standards environments. In addition, a PA using an efficiency enhancement technique such as a Doherty power amplifier (DPA) is able to achieve higher efficiencies than traditional PA designs at the expense of linearity. Therefore, combining digital predistortion with a PA using an efficiency enhancement technique has the potential to improve system linearity and overall efficiency.

However, most digital PDs presuppose that PAs have no memory or a weak memory. This is impractical in wideband applications where memory effects cause the output signal to be a function of current as well as past input signals. The sources of memory effects in PAs include self-heating of the active device (also referred to as long time constant or thermal memory effects) and frequency dependencies of the active device, related to the matching network or bias circuits (also referred to as short time constant or electrical memory effects). As signal bandwidth increases, memory effects of PAs become significant and limit the performance of memoryless digital PDs.

Various approaches have been suggested for overcoming memory effects in digital PDs. For the short-term memory effects, a Volterra filter structure was applied to compensate memory effects using an indirect learning algorithm, but the number of optimization coefficients is very large as the order increases. This complexity makes the Volterra filter based PD extremely difficult to implement in real hardware. A memory polynomial structure, which is a simplified version of the Volterra filter, has been proposed in order to reduce the number of coefficients, but even this simplified version still requires a large computational load. In addition, such a memory polynomial based PD suffers from a numerical instability when higher order polynomial terms are included because a matrix inversion is required for estimating the polynomial coefficients. An alternative, yet equally complex structure based on orthogonal polynomials has been utilized to alleviate the numerical instability associated with the traditional polynomials. To further reduce the complexity at the expense of the performance, the Hammerstein predistorter, which is a finite impulse response (FIR) filter or a linear time invariant (LTI) system followed by a memoryless polynomial PD, has been proposed. The Hammerstein predistorter assumed that the PA models used follow a Wiener model structure which is a memoryless nonlinearity followed by a finite impulse response (FIR) filter or a linear time invariant (LTI) system.

This implementation means that the Hammerstein structure can only compensate for memory effects coming from the RF frequency response. Therefore, if the RF frequency response is quite flat, the Hammerstein PD cannot correct for any other types of memory effects, such as bias-induced and thermal memory effects.

Most recently, a static lookup table (LUT) digital baseband PD cascaded with a sub-band filtering block has been used in order not to compensate for electrical memory effects, but to combat gain and phase variation due to temperature changes of the PA after an initial setting for the fixed LUT PD.

Hence, there has been a long-felt need for a baseband predistortion linearization method able to compensate for not only RF frequency response memory effects but also bias-induced or thermal memory effects in multi-channel wideband wireless transmitters.

SUMMARY OF THE INVENTION

Accordingly, the present invention substantially overcomes many of the foregoing limitations of the prior art, and provides a system and method of baseband predistortion linearization that compensates for nonlinearities as well as memory effects found in multi-channel wideband wireless transmitters. This result is achieved through the use of piecewise pre-equalized PD utilizing a lookup table. With this approach, the present invention is able to compensate for electrical and thermal memory effects while at the same time reducing the computational complexity and the numerical instability of the system as compared with prior art systems using a memory polynomial PD algorithm, while the present invention is comparable to a memory polynomial PD in terms of the resulting linearity in the performance of a multi-band PA.

Further objects and advantages of the invention can be more fully understood from the following detailed description taken in conjunction with the accompanying drawings in which:

BRIEF DESCRIPTION OF THE DRAWINGS

FIG. 9 is a graph showing complexity estimation of the piecewise pre-equalized PD of the present invention.

FIG. 10 is a graph showing complexity estimation of the memory polynomial PD.

DETAILED DESCRIPTION OF THE INVENTION

To overcome the computational complexity and numerical instability of the memory polynomial PD found in the prior art, The present invention, therefore, utilizes an adaptive LUT-based digital predistortion system with a LUT that has been pre-equalized to compensate for memory effects, so as to achieve less computational load than the prior art while also reducing the adjacent channel power ratio (ACPR) to substantially the same degree as the memory polynomial PD has achieved. The system provided by the present invention is therefore referred as a piecewise pre-equalized, lookup table based predistortion (PELPD) system hereafter.

Preferred and alternative embodiments of the PELPD system according to the present invention will now be described in detail with reference to the accompanying drawings.

Figure 1:
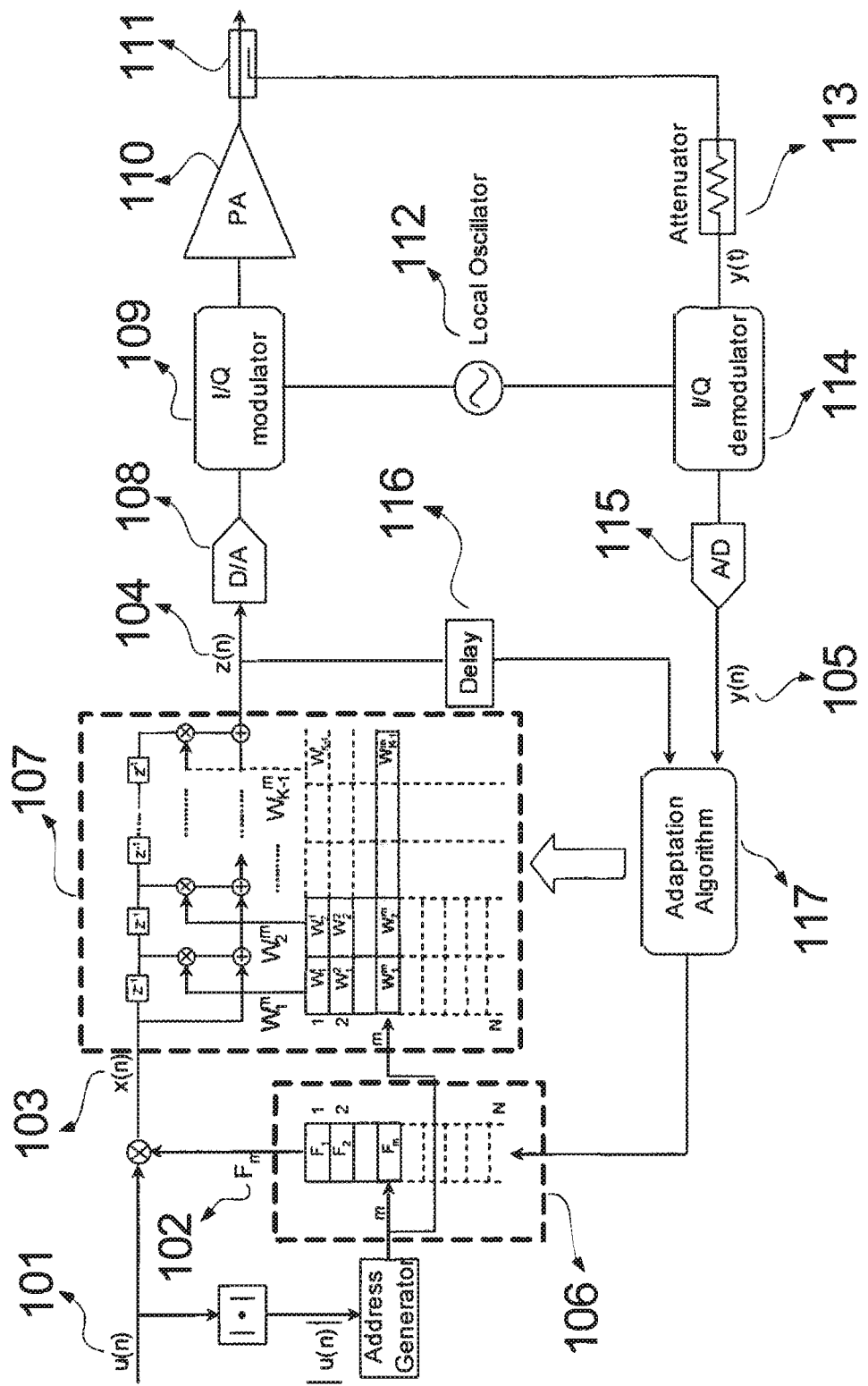
FIG. 1 is a schematic diagram showing a piecewise pre-equalized LUT predistortion system in accordance with the invention.

FIG. 1 is a schematic diagram showing an embodiment of a PELPD system in accordance with the invention. As illustrated, the linear magnitude addressing method for the LUT 106 indexing is used as follows:

$m = \mathrm{round}(|u(n)| \cdot N)$, where u(n) is the input signal 101 and the round function returns the nearest integer number which is the index (m) and N is the LUT 106 size.

The digital complex baseband input signal samples 101 are multiplied prior to pre-equalization 107 by complex coefficients 102 drawn from LUT entries as follows $x(n) = u(n) \cdot F_m(|u(n)|)$, where $F_m(|u(n)|)$ is the complex coefficient 102 corresponding to an input signal 101 magnitude for compensating AM to AM and AM to PM distortions of the PA 110.

N by K−1 filter coefficients in the LUT of the piecewise pre-equalizer 107 are used to compensate for memory effects, where N is the depth of the LUT and the FIR filter has K taps. In some embodiments, the piecewise pre-equalizers 107 use a FIR filter rather than an infinite impulse response (IIR) filter because of stability issues, although a FIR filter is not necessarily required for all embodiments. The output 104 of the pre-equalizers can be described by $$z(n) = \sum_{k=0}^{K-1} W_k^m(|u(n)|) \cdot x(n-k)$$

$$= \sum_{k=0}^{K-1} W_k^m(|u(n)|) \cdot u(n-k) \cdot F_m(|u(n-k)|),$$

where $W_k^m(|u(n)|)$ is the k-th tap and m-th indexed coefficient corresponding to the magnitude of the input signal, u(n) 101. Also, $W_k^m(|u(n)|)$ is a function of $|u(n)|$ and $F_m$ 102 is a function of $(|u(n-k)|)$. For analysis purposes, the memoryless LUT 106 ($F_m$) structure can be replaced by a polynomial model as follows:

$$F_m(|u(n)|) = \sum_{p=1}^{P} b_{2p-1} \cdot |u(n-k)|^{2(p-1)}$$

where 2p−1 is the polynomial order and b is a complex coefficient corresponding to the polynomial order. Moreover, it is noted that the tap coefficients and memoryless LUT coefficients (Fm) 102 depend on u(n) and u(n−k), respectively.

Therefore, each piece of the equalizer can be expressed using a polynomial equation by $$z(n) = \sum_{k=0}^{K-1} W_k^m(|u(n)|) \cdot \sum_{p=1}^{P} b_{2p-1} \cdot u(n-k) \cdot |u(n-k)|^{2(p-1)}$$

where $W_k^m(|u(n)|)$ is the k-th tap coefficient with the m-th index being a function of |u(n)|. Without loss of generality, the piecewise pre-equalizers 107 can be defined similarly using a l-th order polynomial, $$z(n) = \sum_{k=0}^{K-1} \sum_{p=1}^{L} w_{k,2l-1} \cdot |u(n)|^{2(l-1)} \times \sum_{p=1}^{P} b_{2p-1} \cdot u(n-k) \cdot |u(n-k)|^{2(p-1)}$$

where $w_{k,l}$ is the k-th tap and l-th order coefficient.

After digital-to-analog converting 108 of z(n)104, this signal is up-converted 109 to RF, amplified by the PA 110 generating distortions, attenuated 113, down-converted 114 to baseband, and then finally analog-to-digital converted 115 and applied to the delay 116 estimation algorithm 117. The feedback signal, that is, the output of the PA 110 with delay, y(n−Δ) 105 can be described by $$y(n-\Delta) = G(|z(n-\Delta)|) \cdot e^{j \cdot \Phi(|z(n-\Delta)|)}$$

where G(·) and Φ(·) is AM/AM and AM/PM distortions of the PA 110, respectively and Δ is the feedback loop delay. For estimating Δ, a correlation technique was applied as follows:

$$R(d) = \frac{1}{N} \sum_{n=0}^{N-1} z(n) \cdot y^*(n+d)$$

where d is the delay variable and N is the block size to correlate.

After delay 116 estimation, the memoryless LUT 106 coefficients can be estimated by the following equation which is the least mean square (LMS) algorithm with indirect learning.

$$F_m(|u(n+1)|) = F_m(|u(n)|) + \mu \cdot u(n) \cdot e(n)$$

where n is the iteration number, μ is the stability factor and e(n) is $x(n) - y(n) \cdot F_m(|x(n)|)$.

It should be pointed out that addressing already generated can be reused for indexing y(n)105 which is a distorted signal able to cause another error due to incorrect indexing. During this procedure, the samples, x(n) 103, should bypass by the piecewise pre-equalizers 107. After convergence of this indirect learning LMS algorithm, the equalizers 107 are activated. An indirect learning method with an LMS algorithm has also been utilized for adaptation of the piecewise filter coefficients. The input of the multiple equalizers 107 in the feedback path is written in vector format as $$y_{FI}(n) = [y_F(n) y_F(n-1) \ldots y_F(n-K+1)]$$

where $y_F(n)$ is the post LUT output, that is, $y(n) \cdot F_m(|y(n)|)$.

Therefore, the multiple FIR filter outputs, yFO(n), can be derived in vector format using the following equations.

$$y_{FO}(n) = W^m \cdot y_{FI}(n)^T$$

$$W^m = [W_0^m W_1^m \ldots W_{k-1}^m]$$

where T is a transpose operator.

Adaptation of the tap coefficients of the pre-equalizers 107 can be obtained as follows:

$$W^m(|u(n+1)|) = W^m(|u(n)|) + \mu \cdot (y_{FI}(n)^T)^* \cdot E(n)$$

where E(n) is the error signal between z(n) and yFO(n), and μ is the step size (* represents the complex conjugate). The adaptation algorithm determines the values of the coefficients by comparing the feedback signal and a delayed version of the input signal.

Referring to the feedback path beginning at output 111, it will be appreciated that several alternatives exist for using such feedback to update the LUT values or polynomial coefficients. In some embodiments, the output of the PA is converted to baseband, and the resulting baseband signal is compared to the input signal. The resulting error is used to correct the LUT values and coefficients. In other embodiments, the output from the PA is spectrally monitored and the out of band distortion is monitored using a downconverter, bandpass filter and power detector. The power detector value is then used to adjust the LUT values or polynomial coefficients.

Figure 2:
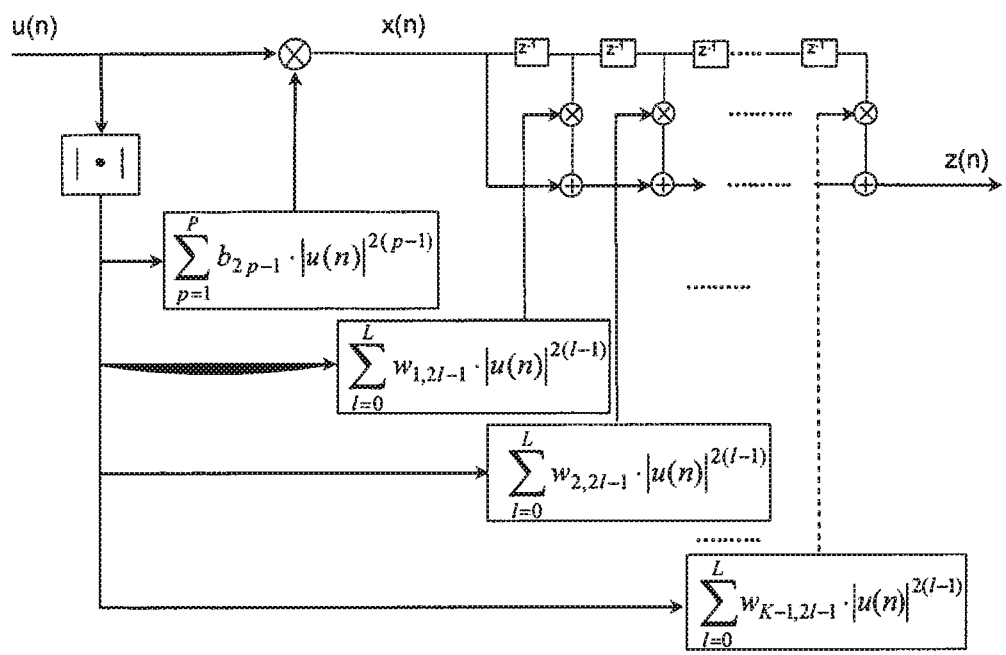
FIG. 2 is a schematic diagram showing a polynomial-based embodiment of the equalizer 107 of FIG. 1.

FIG. 2 illustrates the corresponding block diagram of the piecewise pre-equalizers 107 PD when polynomial equations are utilized. The polynomial representation requires too many complex multiplications similar to the Volterra series. The complexity is reduced when a PELPD-based approach, as shown in FIG. 1, is utilized, because fewer calculations are required, although more memory may be required. It will be appreciated from the discussion herein that the pre-equalizing portion is adaptive and designed to correct memory effects, while the lut serves primarily to pre-distort to correct the other nonlinearities found in commercial PA's.

Figure 3A:
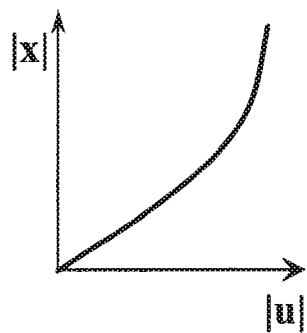
FIG. 3A is a graph showing complex gain adjuster response.
Figure 3B:
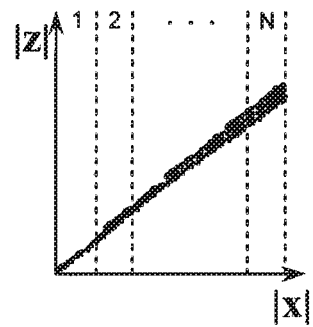
FIG. 3B is a graph showing piecewise equalizer response in accordance with the invention.
Figure 3C:
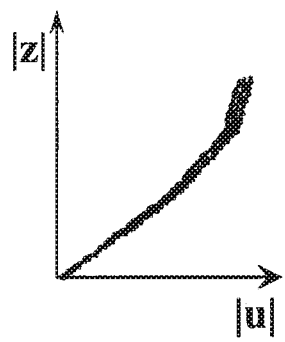
FIG. 3C is a graph showing response of the cascade of complex gain adjuster and piecewise equalizers in accordance with the invention.
Figure 3D:
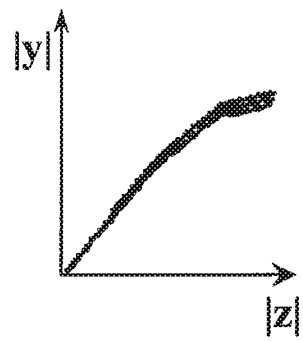
FIG. 3D is a graph showing a power amplifier response
Figure 3E:
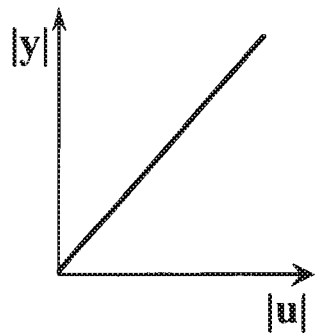
FIG. 3E is a graph showing detailed response from the response of the cascade of complex gain adjuster and piecewise equalizers and the complex gain adjuster response.

FIGS. 3A-3D are graphical explanations of the PELPD of the present invention. A typical memoryless predistorter response is shown in FIG. 3A. FIG. 3B demonstrates the hysteresis created by the piecewise pre-equalizers divided into N pieces. Since the hysteresis of the power amplifier is not necessarily uniformly distributed over the whole input magnitude range, the piecewise pre-equalizers are applied to achieve a uniform compensation across the entire input range. The output of the PELPD of the present invention is illustrated in FIG. 3C, which can be thought of as resulting from a cascade of FIGS. 3A and 3B. FIG. 3D shows the response of a typical power amplifier response and FIG. 3B results in the PELPD of the present invention as represented in FIG. 3C. FIG. 3D shows the response of a typical power amplifier response with memory. The desired linear response in FIG. 3E is achieved after FIG. 3C and FIG. 3D are cascaded.

In order to examine the performance of the PELPD of the present invention, the behavioral modeling of a PA based on time domain measurement samples was first carried out. The behavioral model was based on the truncated Volterra model. A 300 W peak envelope power (PEP) Doherty PA using two 170 W push-pull type laterally diffused metal oxide semiconductors (LDMOS) at the final stage was designed. This Doherty PA operates at 2140 MHz band and has 61 dB of gain and 28% power added efficiency (PAE) at an average 30 W output power. To construct the PA model based on measurements of the actual PA, the test bench was utilized [K. Mekechuk, W. Kim, S. Stapleton, and J. Kim, "Linearinzing Power Amplifiers Using Digital Predistortion, EDA Tools and Test Hardware," High Frequency Electronics, pp. 18-27, April 2004]. Based on the behavioral model, various types of PDs including a memoryless LUT PD, a Hammerstein PD, the PELPD of the present invention and a memory polynomial PD have been simulated and the adjacent channel power ratio (ACPR) performances are compared. The LUT size was fixed to 128 entries through all simulations, which is a compromise size considering quantization effects and memory size. Those skilled in the art will recognize that the amount of compensation for nonlinearities is related to the size of the LUT 106. Increases in LUT size, while yielding a more accurate representation of the non-linearities, comes at the cost of more effort in the adaptation. Thus, selection of LUT size is a trade-off between accuracy and complexity.

As a test signal, a single downlink W-CDMA carrier with 64 dedicated physical channels (DPCH) of Test Mode based on 3rd Generation Partnership Project (3GPP) standard specifications, which has 3.84 Mchips/s and 9.8 dB of a crest factor. First, an eight tone signal with 500 kHz spacing which has 9.03 dB of PAR and 4 MHz bandwidth, which is comparable to a W-CDMA signal, was used for verifying the proposed method.

Figure 4A:
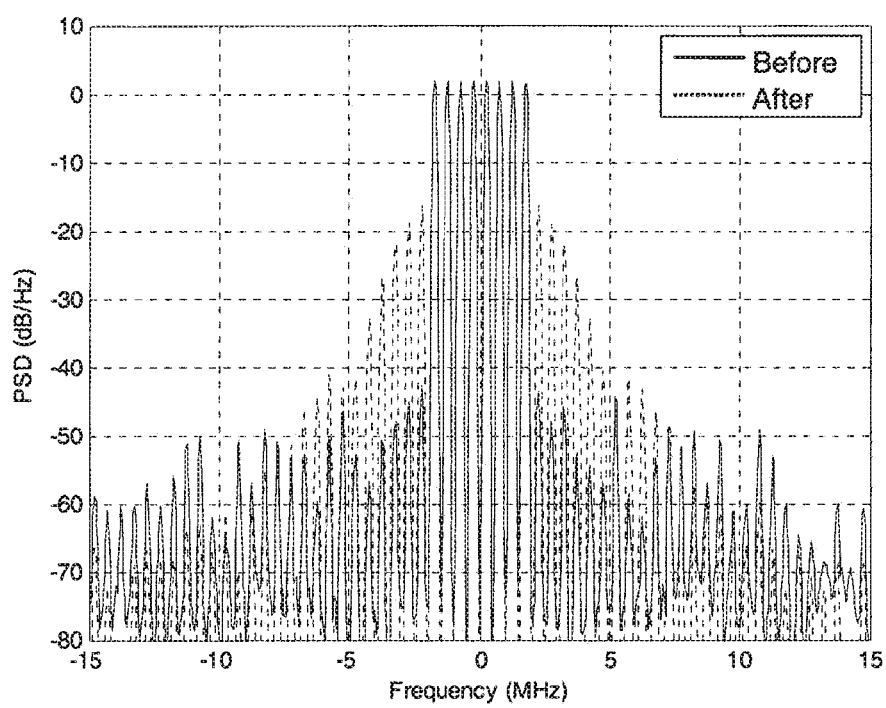
FIG. 4A is a graph showing representative linearization results before and after linearization with an embodiment of a memoryless LUT PD using an eight tone test signal with 500 kHz spacing.
Figure 4B:
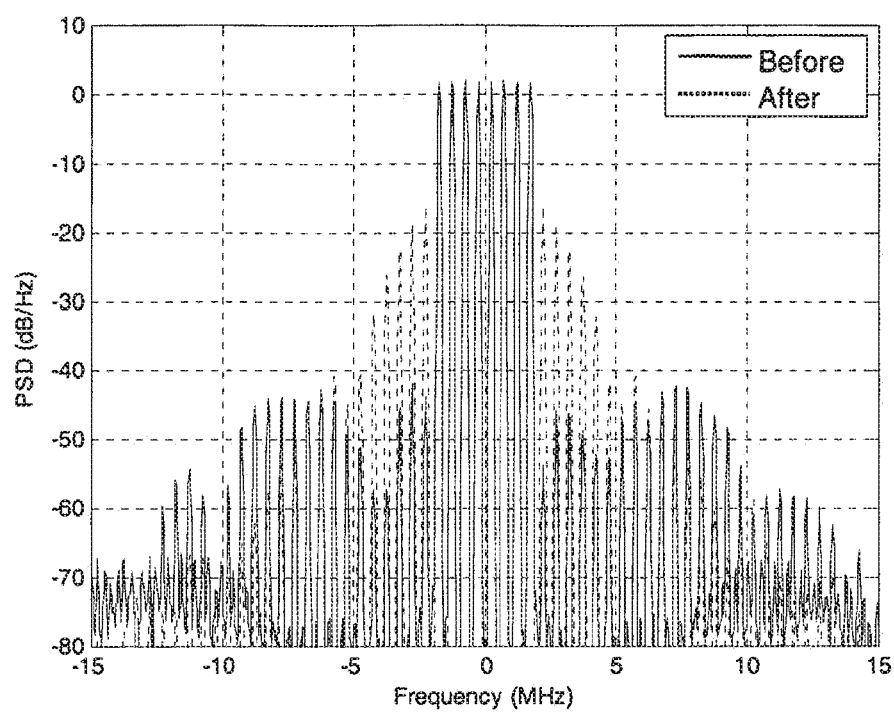
FIG. 4B is a graph showing representative linearization results before and after linearization with a LUT Hammerstein PD using an eight tone test signal with 500 kHz spacing.
Figure 4C:
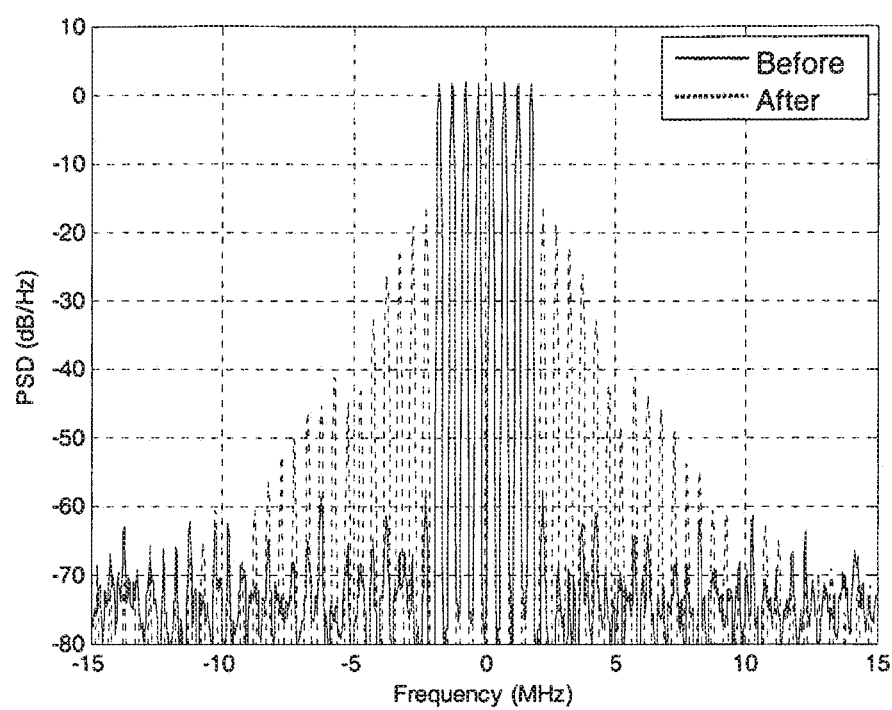
FIG. 4C is a graph showing representative linearization results before and after linearization with a piecewise pre-equalized PD of the present invention using an eight tone test signal with 500 kHz spacing.
Figure 4D:
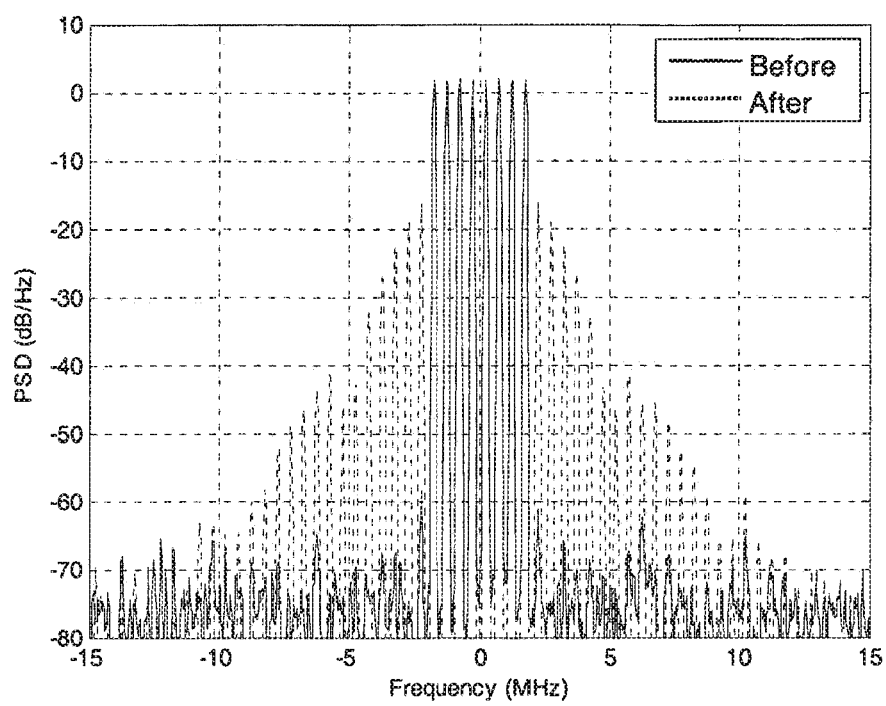
FIG. 4D is a graph showing representative linearization results before and after linearization with a memory polynomial PD using an eight tone test signal with 500 kHz spacing.

FIGS. 4A-4D are graphs showing representative linearization results before and after linearization of the four types of PD. As shown in FIG. 4A, a conventional memoryless LUT PD was able to improve the linearity and also compensate for the memory effects. FIG. 4B shows a conventional Hammerstein PD which deteriorates the performance above 10 MHz and improves it within a 10 MHz bandwidth. If the RF frequency response in the main signal path is quite flat, the Hammerstein PD is not able to correct any other memory effects except for frequency response memory effects. There is also no obvious improvement for reducing spectral regrowth using the conventional Hammerstein PD. It is very clear that the ability of the Hammerstein PD for suppressing distortions coming from memory effects is quite limited. FIG. 4C shows the performance of the PELPD of the present invention (with 2 taps). FIG. 4D illustrates the performance of a conventional memory polynomial PD (with 5th order and two memory terms). By comparing FIGS. 4A-4D, it can be seen that the PELPD of the present invention is comparable to the memory polynomial PD in terms of ACPR performance.

Figures 5, 6:
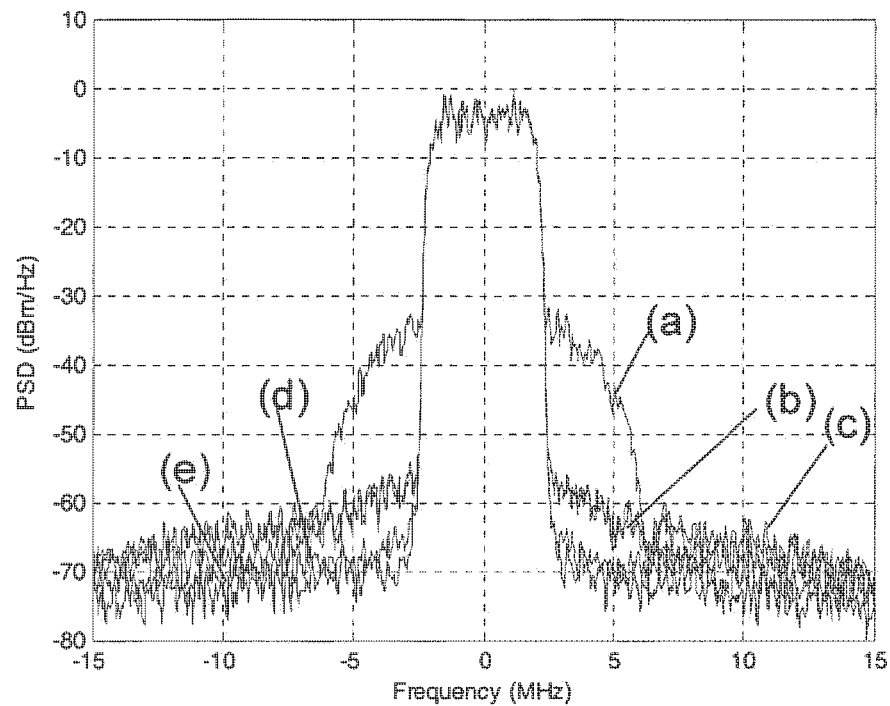
FIG. 5 is a graph showing representative linearization results for the four types of PDs consisting of a memoryless LUT PD, a LUT Hammerstein PD, a piecewise pre-equalized PD of the present invention, and a memory polynomial PD using a sigble W-CDMA carrier, respectively.
FIG. 6 is a graph showing performance comparisons of the simulation results of the ACPR for the four types of PD consisting of a memoryless LUT PD, a LUT Hammerstein PD, a piecewise pre-equalized PD of the present invention, and a memory polynomial PD using a single W-CDMA carrier, respectively.

FIG. 5 is a graph showing linearization results for the four types of PD mentioned above. A single W-CDMA carrier was applied to the LUT PD, the LUT Hammerstein PD, the PELPD of the present invention, and the memory polynomial PD.

FIG. 6 is a graph showing performance comparisons of the simulation results of the ACPR for the 4 types of, respectively. The conventional Hammerstein PD was unable to improve any distortions coming from memory effects over the memoryless PD. The PELPD of the present invention could suppress distortions due to nonlinearities as well as memory effects of the PA.

After verifying the ACPR performance of the PELPD of the present invention in the simulations based on the behavioral PA model, an experiment was performed using the actual Doherty PA in the test bench. The transmitter prototype consists of an ESG which has two digital to analog converters (DACs) and a RF up-converter, along with the PA. The receiver comprises an RF down-converter, a high speed analog to digital converter, and a digital down-converter. This receiver prototype can be constructed by a VSA. For a host DSP, a PC was used for delay compensation and the predistortion algorithm. As a test signal, two downlink W-CDMA carriers with 64 DPCH of Test Model 1 which has 3.84 Mchips/s and 9.8 dB of a crest factor was used as the input signal in the measurements in order to verify the compensation performance of the different PDs. All coefficients of PDs are identified by an indirect learning algorithm which is considered to be inverse modeling of the PA. During the verification process, a 256-entry LUT, 5 taps FIR filter for Hammerstein PD, the PELPD of the present invention (with 2 taps), and a 5th order-2 delay memory polynomial were used. The choice of the number of taps was optimized from several measurements.

Figures 7, 8:
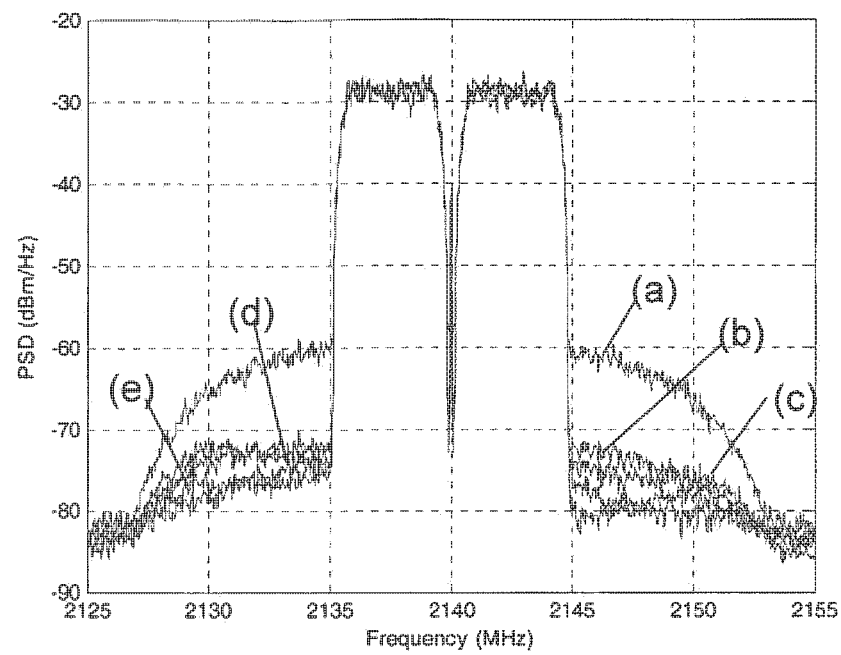
FIG. 7 is a graph showing measured linearization results for the 4 types of PD consisting of a memoryless LUT PD, a LUT Hammerstein PD, a piecewise pre-equalized PD of the present invention, and a memory polynomial PD using a single W-CDMA carrier, respectively.
FIG. 8 is a graph showing performance comparisons of the measurement results of the ACPR for the 4 types of PD consisting of a memoryless LUT PD, a LUT Hammerstein PD, a piecewise pre-equalized PD of the present invention, and a memory polynomial PD using a single W-CDMA carrier, respectively.

FIG. 7 is a graph showing the measured linearization results before and after linearization of the 4 types of PD using a single W-CDMA carrier, respectively. ACPR calculation at the output of the prototype transmitter, is performed at a frequency offset (5 MHz and −5 MHz) from the center frequency.

FIG. 8 is a graph showing performance comparisons of the measurement results of the ACPR for the 4 types of PD using a single W-CDMA carrier, respectively. The ACPR value for the transmitter with the Hammerstein PD having a 5 tap FIR filter is about 1 dB better than a LUT PD on the upper ACPR (5 MHz offset) and the same at the lower ACPR (−5 MHz offset). The PELPD of the present invention and a 5th order-2 memory polynomial PD show close compensation performance in terms of ACPR. Both are able to improve the ACPR about 4 dB and 6 dB more than Hammerstein PD and a memoryless LUT PD, for the lower and upper ACPR, respectively.

The complexity of the PELPD method of the present invention and the memory polynomial method is also evaluated (neglecting LUT readings, writings, indexing, and calculation of the square root (SQRT) of the signal magnitude, because LUT indexing depends not only on the methods, but also on the variable, for example, magnitude, logarithm, power, and so on and the SQRT operation can be implemented in different ways). Therefore, the complexity is only estimated by counting the number of additions (subtractions) and multiplications per input sample. In order to consider a real hardware implementation, complex operations are converted into real operations and memory size is also considered. For example, one complex multiplication requires two real additions and four real multiplications. If N is the number of LUT entries, memory size required is 2N (I&Q LUTs).

FIG. 9 is a graph showing complexity estimation of the PELPD of the present invention. If the LUT has 256 entries and the filters have 2 taps, the PD requires 40 real additions (subtractions), 54 real multiplications per sample, and a memory size of 1542. The PELPD of the present invention requires the same number of additions and multiplications as the traditional Hammerstein PD, but requires more memory.

FIG. 10 is a graph showing complexity estimation of the memory polynomial PD using an RLS indirect learning algorithm. The number of arithmetic operations are given in FIG. 11, where O is equal to P(K+1). For example, P=5 and K=1 require 1342 real additions (subtractions), 1644 real multiplications per sample, and memory size of 24. In a comparison of the number of multiplications with the PELPD of the present invention, the memory polynomial PD requires 300 times more real multiplications per sample. Therefore, the complexity is significantly reduced by the PELPD method. In addition, the number of real multiplication for the memory polynomial method grows as the square power of the polynomial order and memory length.

In summary, the PELPD of the present invention, compared to the conventional Hammerstein approach, could reduce spectral regrowth more effectively and achieve a similar correction capability with the memory polynomial PD, but requires much less complexity.

Although the present invention has been described with reference to the preferred and alternative embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method comprising:
providing a pre-distortion lookup table (LUT) having N first entries, N being an integer equal to or greater than unity;
providing a pre-equalization lookup table (LUT) having M second entries, M being an integer equal to or greater than unity, the pre-equalization LUT being associated with a pre-equalizer;
determining an index based on a magnitude of a baseband input signal;
generating a sample by multiplying the baseband input signal with an entry of the N first entries in accordance with the index; and
pre-equalizing the sample using an entry of the M second entries in accordance with the index to generate a pre-equalized signal,
wherein the baseband input signal is a digital complex signal, and each entry of the pre-distortion LUT comprises complex coefficients, and
wherein the complex coefficients are obtained by:
converting the sample to an analog baseband signal by an analog-to-digital converter while bypassing the pre-equalizer;
frequency upconverting the analog baseband signal to an upconverted signal;
amplifying the upconverted signal by a power amplifier to obtain an amplified signal;
attenuating the amplified signal to an attenuated signal;
frequency downconverting the attenuated signal to a baseband signal; and
performing an indirect learning least mean square (LMS) algorithm using the baseband signal and the baseband input signal to obtain the complex coefficients.

2. The method of claim 1, wherein the pre-equalizer comprises a finite impulse response (FIR) filter, and each entry of the M second entries comprises coefficients corresponding to coefficients of the FIR filter.

3. The method of claim 1, wherein N is equal to M.

4. A method comprising:
providing a pre-distortion lookup table (LUT) having N first entries, N being an integer equal to or greater than unity;
providing a pre-equalization lookup table (LUT) having M second entries, M being an integer equal to or greater than unity, the pre-equalization LUT being associated with a pre-equalizer;
determining an index based on a magnitude of a baseband input signal, wherein determining the index comprises:
converting the magnitude of the baseband input signal to an absolute value;
multiplying the absolute value by N to obtain a product; and
rounding the product to a nearest integer number; and
generating a sample by multiplying the baseband input signal with an entry of the N first entries in accordance with the index; and
pre-equalizing the sample using an entry of the M second entries in accordance with the index to generate a pre-equalized signal.

5. The method of claim 4, further comprising
converting the pre-equalized signal to an analog baseband signal;
frequency upconverting the analog baseband signal to an upconverted signal; and
amplifying the upconverted signal by a power amplifier to obtain an amplified signal.

6. The method of claim 5, further comprising:
attenuating the amplified signal to an attenuated signal;
frequency downconverting the attenuated signal to a baseband signal;
comparing the baseband signal with the baseband input signal; and
adjusting at least one of the N first entries or at least one of the M second entries based on a comparison result.

7. The method of claim 6, further comprising:
bandpass filtering the baseband signal to obtain a bandpass filtered signal;
monitoring out-of-band distortions of the bandpass filtered signal; and
adjusting at least one of the N first entries or at least one of the M second entries based on the out-of-band distortions.

8. The method of claim 7, wherein monitoring the out-of-band distortion comprises detecting a power value of the bandpass filtered signal by a power detector.

9. A system comprising:
an address generator configured to generate an address based on a magnitude of a baseband input signal;
a memoryless lookup table having a plurality of first entries each including coefficients for compensating distortions of a power amplifier;
a multiplier configured to generate a sample from the baseband input signal and an entry of the memoryless lookup table retrieved by the address;
a pre-equalizer comprising a filter and a pre-equalization lookup table having a plurality of second entries each including coefficients for the filter, the pre-equalizer configured to pre-equalizer the sample to generate a pre-equalized signal;
an attenuator coupled to the power amplifier and configured to produce an attenuated a frequency downconverter coupled to the attenuator and configured to produce a downconverted signal from the attenuated signal;
an analog-to-digital converter coupled to the frequency downconverter and configured to produce a baseband signal;
a delay circuit coupled to the pre-equalizer and configured to generate a delayed signal;
wherein the system updates the memoryless lookup table in response to a difference between the baseband signal and the delayed signal; and
a local oscillator commonly shared by a frequency upconverter and the frequency downconverter, wherein the system updates the memoryless lookup table using an indirect learning least mean square algorithm, the pre-equalizer is bypassed, and the delayed signal is a delayed version of the sample.

10. The system of claim 9, wherein the filter is a finite impulse response (FIR) filter having a number of taps, and each entry of the second entries comprise coefficients corresponding to the number of taps of the FIR filter.

11. The system of claim 9, wherein the baseband input signal is a digital complex signal, and each entry of the memoryless lookup table comprises complex coefficients.

12. The system of claim 9, further comprising:
a digital-to-analog converter coupled to the pre-equalizer and configured to produce an analog signal from the pre-equalized signal;
the frequency upconverter configured to convert the analog signal to an upconverted signal; and
the power amplifier configured to amplify the upconverted signal to an amplified signal.

13. The system of claim 9, further comprising:
a bandpass filter configured to produce a bandpass filtered signal from the downconverted signal; and
a power detector configured to produce a power detection value to is used to adjust values of the first entries of the memoryless lookup table or values of the second entries of the pre-equalization lookup table.

* * * * *